United States Patent
Chen

(10) Patent No.: US 6,255,152 B1
(45) Date of Patent: Jul. 3, 2001

(54) METHOD OF FABRICATING CMOS USING SI-B LAYER TO FORM SOURCE/DRAIN EXTENSION JUNCTION

(75) Inventor: Tung-Po Chen, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/410,690

(22) Filed: Oct. 1, 1999

(51) Int. Cl.$^7$ ................................................ H01L 21/8238
(52) U.S. Cl. .................... 438/199; 438/223; 438/224; 438/227; 438/229; 438/230; 438/232
(58) Field of Search ................................... 438/199, 207, 438/213, 217, 218, 221, 223, 224, 227, 228, 229, 230, 231, 232

(56) References Cited

U.S. PATENT DOCUMENTS

| | | | |
|---|---|---|---|
| 5,234,850 | * | 8/1993 | Liao ....................................... 438/232 |
| 5,759,885 | * | 6/1998 | Son ........................................ 438/230 |
| 6,028,339 | * | 2/2000 | Frenette et al. ....................... 257/364 |
| 6,157,064 | * | 12/2000 | Huang .................................... 257/344 |

\* cited by examiner

Primary Examiner—Charles Bowers
Assistant Examiner—Jack Chen

(57) ABSTRACT

A method of fabricating a CMOS transistor using Si—B layer to form a source/drain extension junction is disclosed. The fabrication includes the steps as follows; First, a p-type semiconductor substrate and an n-well region are provided. Afterwards, a shallow trench isolation (STI) is formed into the p-type semiconductor substrate and the n-well region, thereby forming a plurality of active regions therebetween. A channel is formed into the p-type semiconductor substrate and the n-well region. Then, a PMOSFET gate pattern and an NMOSFET gate pattern are formed over the p-type semiconductor substrate and the n-well region. A first defined photoresist layer is formed over the n-well region. Afterwards, the $n^-$-type dopant is implanted into the p-type semiconductor substrate to form an $n^-$-type lightly doped source/drain. Then the first defined photoresist layer is removed. A first dielectric layer is deposited over the p-type semiconductor substrate and the n-well region. A second defined photoresist layer is formed over the first dielectric layer. Afterwards, a portion of the first dielectric layer is firstly etched over the n-well region. Then an offset spacer is formed on the n-well region during a portion of the first dielectric layer etching step. Next, the second defined photoresist layer is removed. A Si—B (silicon-boron) layer is deposited over the n-well region and the first dielectric layer. The Si—B layer is oxidized to form a BSG layer, thereby firstly diffusing boron atoms into the n-well region to form a $p^-$-type lightly doped source/drain. Afterwards, a second dielectric layer is deposited on the BSG layer. Next, a first BSG spacer and a second BSG spacer are formed, thereby etching a portion of the second dielectric layer, a portion of the BSG layer, and secondly etching a portion of the first dielectric layer. Afterwards, an $n^+$-type heavily doped source/drain is formed into the p-type semiconductor substrate. Next, a $p^+$-type heavily doped source/drain is formed into the n-well region. Finally, the first BSG spacer is annealed, thereby secondly diffusing boron atoms into the bottom region of the first BSG spacer to form a source/drain extension junction in a PMOSFET.

57 Claims, 3 Drawing Sheets

METHOD OF FABRICATING CMOS USING SI-B LAYER TO FORM SOURCE/DRAIN EXTENSION JUNCTION

BACKGROUND OF THE INVENTION

1. Field of the Invention

The present invention relates to a method of fabricating complementary metal-oxide-semiconductor (CMOS) transistor, and more particularly to a method of fabricating CMOS transistor using Si—B layer to form a source/drain extension junction.

2. Description of the Prior Art

Recently, ultra large-scale integration (ULSI) semiconductor technologies have dramatically increased the integrated circuit density on the chips formed on the semiconductor substrate. This increase in circuit density has resulted from downsizing of the individual devices and the resulting increase in device packing density. The reduction in device size was achieved predominantly by recent advances in high-resolution photolithography, directional (anisotropic) plasma etching, and other semiconductor technology innovations. However, future requirements for even greater circuit density are putting additional demand on the semiconductor processing technologies and on device electrical requirements.

The fabrication of a metal-oxide-semiconductor field effect transistor (MOSFET) device is well-known. Generally, MOSFETs are manufactured by placing an undoped polysilicon material over a relatively thin gate oxide. The polysilicon material and gate oxide is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-type, then the resulting MOSFET is a PMOSFET ("p-channel") transistor device.

The gate conductor and adjacent source/drain regions are formed using well-known photolithography techniques. Gate conductors and source/drain regions arise in openings formed through a thick layer of what is commonly referred to as field oxide (FOX). Those openings and the transistors formed therein are termed active regions. The active regions are therefore regions between field oxide regions. Metal interconnect is routed over the field oxide to couple with the polysilicon gate conductor as well as with source/drain regions to complete the formation of an overall circuit structure.

Integrated circuits utilize either n-channel devices exclusively, p-channel devices exclusively, or a combination of both on unitary monolithic substrate. While both types of devices can be formed, the devices are distinguishable based on the source/drain impurity dopant. The method by which n-type dopant is used to form an n-channel device and p-type dopant is used to form a p-channel device entail unique problems associated with each device. As layer densities increase, the problems are exacerbated. Device failure can occur unless adjustments are made to processing parameters and processing steps. The n-channel processing must, in most instances, be dissimilar from p-channel processing due to the unique problems of each type of device. The problems inherent in n-channel fabrication will be discussed first followed by p-channel.

The n-channel devices are particularly sensitive to so-called short channel effects. The distance between source and drain regions is often referred to as the physical channel length. However, after implantation and subsequent diffusion of the source and drain, distance between the source and drain regions becomes less than the physical channel length and is often referred to as the effective channel length. In VLSI designs, as the physical channel becomes small, the short channel effect becomes a predominant problem.

Generally, the short channel effect impacts device operation by reducing device threshold voltages and increasing sub-threshold currents. As the effective channel length becomes quite small, the depletion regions associated with the source and drain areas may extend toward one another and substantially occupy the channel area. Hence, some of the channel will be partially depleted without any influence of gate voltage. As a result, less gate charge is required to invert the channel of a transistor having a short effective channel length. Somewhat related to threshold voltage lowering is the concept of sub-threshold current flow. Even at times when the gate voltage is below the threshold amount, current between the source and drain nonetheless exist for transistors having a relatively short effective channel length.

However, two of the primary causes of increased sub-threshold current are punch-through and drain-induced barrier lowering. Punch-through results from the widening of the drain depletion region when a reverse-bias voltage is applied across the drain-well diode. The electric field of the drain may eventually penetrate to the source area, thereby reducing the potential energy barrier of the source-to-body junction. Punch-through current is therefore associated within the substrate bulk material, well below the substrate surface. Contrary to punch-through current, drain-induced barrier lowering for induced current occurs mostly at the substrate surface. Application of a drain voltage can cause the surface potential to be lowered, resulting in a lowered potential energy barrier at the surface and causing the sub-threshold current in the channel near the silicon-silicon dioxide interface to be increased. One method in which to control short channel effect is to increase the dopant concentration within the body of the device. Unfortunately, increasing dopant within the body deleteriously increases potential gradients in the ensuing device.

Increasing the potential gradients produces an additional effect known as hot carrier effect. The hot carrier effect is a phenomena by which the kinetic energy of the carriers (holes or electrons) is increased as they are accelerated through large potential gradients and subsequently become trapped within the gate oxide. The greatest potential gradient, often referred to as the maximum electric field, occurs near the drain during saturated operation. More specifically, the electric field is predominant at the lateral junction of the drain adjacent the channel.

Using the n-channel example, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the hole flows into the bulk to produce a substrate current in the device. The substrate current is the first indication of the creation of hot carriers in a device. For p-channel devices, the fundamentals of the process are essentially the same except that the role of holes and electrons are reversed.

The hot carrier effect occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is known that since hot electrons are more mobile than hot holes, the hot carrier effect causes a greater threshold skew in n-channel devices than p-channel devices. Nonetheless, a p-channel device will undergo negative threshold skew.

Unless modifications are made to the transistor structure, the problems of sub-threshold current and threshold shift resulting from short channel effect and hot carrier effect will remain. To overcome these problems, alternative drain structures such as double diffused drains (DDDs) and lightly doped drains (LDDs) must be used. The purpose of both types of structures is the same: to absorb some of the potential into the drain and thus reduce the maximum electric field. The popularity of double diffused drain structures has given way to lightly doped drain structures since double diffused drains cause unacceptably deep junctions and deleterious junction capacitance.

A conventional lightly doped drain structure is one whereby a light concentration of dopant is self-aligned to the gate electrode followed by a heavier dopant self-aligned to the gate electrode on which two sidewall spacers have been formed. The purpose of the first implant dose is to produce a lightly doped section of both the source and drain areas at the gate edge near the channel. The second implant dose is spaced from the channel a distance dictated by the thickness of the sidewall spacer. Resulting from the first and second implants, a dopant gradient occurs at the junction between the source and channel as well as the junction between the drain and channel.

A properly defined lightly doped drain structure must be one which minimizes hot carrier effect but not at the expense of excessive source/drain resistance. The addition of a lightly doped drain implant adjacent the channel unfortunately adds resistance to the source/drain path. This added resistance, generally known as parasitic resistance, can have many deleterious effects. First, parasitic resistance can decrease the saturation current (i.e., current above threshold). Second, parasitic resistance can decrease the overall speed of the transistor.

A properly designed lightly doped source/drain, which overcomes the above problems, must therefore be applicable to both an n-channel transistor and a p-channel transistor. However, the approach will be used in CMOS processes. The CMOS transistor is readily fabricated within existing process technologies. In accordance with many modern fabrication techniques, it would be desirable that the improved CMOS transistor be formed having low resistance and the ultra shallow junction.

SUMMARY OF THE INVENTION

In accordance with the present invention, a method is provided for forming a complementary metal-oxide-semiconductor (CMOS) transistor of low resistance and ultra shallow junction. However, the CMOS structure is typically formed including p-well CMOS transistor, n-well CMOS transistor, and twin-well CMOS transistor. Moreover, while the n-well CMOS processes will be described in this embodiment other types of CMOS structures can also be included. In this embodiment, the fabrication process includes the steps as follows. At first, a CMOS transistor region is provided on and in a single crystal silicon substrate doped with a p-type dopant. Then an n-well region is formed into a p-type semiconductor substrate. Afterwards, relatively deep shallow trench isolation (STI) is formed into the p-type semiconductor substrate and a portion of the n-well region, thereby forming a PMOSFET active region and an NMOSFET active region. A channel is formed into the PMOSFET active region and the NMOSFET active region. Afterwards, a gate oxide layer is formed on the PMOSFET active region and the NMOSFET active region. Then a polysilicon gate is deposited on the gate oxide layer. Next, the polysilicon gate and the gate oxide layer are etched to form a PMOSFET gate pattern on the PMOSFET active region and an NMOSFET gate pattern on the NMOSFEIT active region. A first defined photoresist layer is formed over the PMOSFET active region and a portion of the shallow trench isolation. Afterwards, an n⁻-type dopant is implanted into the NMOSFET active region to form an n⁻-type lightly doped source/drain. Then the first defined photoresist layer is removed. A first dielectric layer is deposited on the shallow trench isolation, the NMOSFET gate pattern, the PMOSFET gate pattern, the NMOSFET active region, and the PMOSFET active region. A second defined photoresist layer is formed over the first dielectric layer. Afterwards, a portion of the first dielectric layer is firstly etched on the PMOSFET active region and a portion of the shallow trench isolation. Then an offset spacer is formed on the PMOSFET active region during a portion of the first dielectric layer-etching step. Next, the second defined photoresist layer is removed. A Si—B (silicon-boron) layer is deposited on a portion of the shallow trench isolation, the PMOSFET active region, the PMOSFET gate pattern, the offset spacer, and the first dielectric layer. The Si—B layer is oxidized to form a BSG layer, thereby firstly diffusing boron atoms into the PMOSFET active region to form a p⁻-type lightly doped source/drain. Afterwards, a second dielectric layer is deposited on the BSG layer. Next, a first BSG spacer and a second BSG spacer is formed, thereby etching a portion of the second dielectric layer, a portion of the BSG layer, and secondly etching a portion of the first dielectric layer. Afterwards, a p⁺-type dopant is implanted into the PMOSFET active region to form a p⁺-type heavily doped source/drain. Next, an n⁺-type dopant is implanted into the NMOSFET active region to form an n⁺-type heavily doped source/drain. Finally, the first BSG spacer is annealed, thereby secondly diffusing boron atoms into the bottom region of the first BSG spacer to form a source/drain extension junction in a PMOSFET.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A method of fabricating a complementary metal-oxide-semiconductor (CMOS) transistor using BSG film to form PMOS source/drain extension junction will now be described in detail. The CMOS structure is typically formed, including a p-well CMOS transistor, an n-well CMOS transistor, and a twin-well CMOS transistor. However, while the n-well CMOS processes will be described in this embodiment, other types of CMOS structures can also be included. FIGS. 1 through 8 show the cross-sectional views illustrative of various stages in the CMOS transistor in accordance with one embodiment of the present invention.

Figure 1:
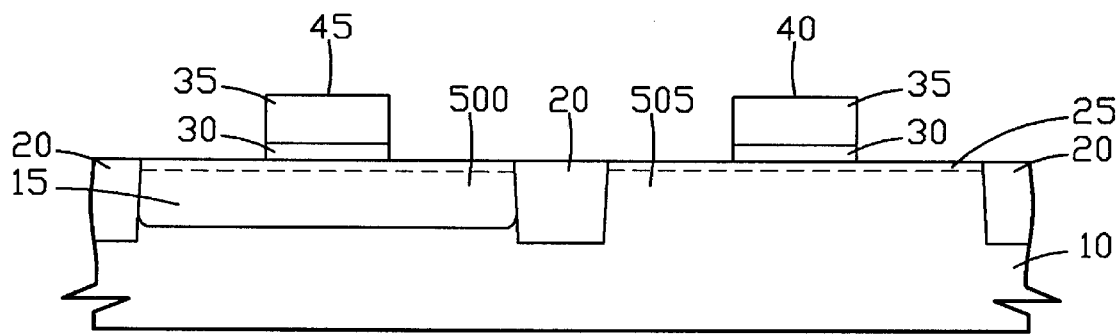
FIGS. 1 through 9 show the cross-sectional views illustrative of various stages in the CMOS transistor in accordance with one embodiment of the present invention.

Referring to FIG. 1, a CMOS transistor region is provided on and in a lightly doped p-type single crystal silicon substrate, having a <100> crystallographic orientation. The p-type semiconductor substrate 10 comprises a concentration less than about 1.0 E 15 atoms/cm$^3$. Then the n-well region 15 is formed, using ion implantation procedures and phosphorus (P) as an ion source, at an energy between about 100 KeV to 200 KeV, to implant a dosage between about 1.0 E 12 to 1.0 E 13 atoms/cm$^2$, then using a driving-in process, at a temperature about 1000° C. to form a concentration about 1.0 E 16 atoms/cm$^3$, into the p-type semiconductor substrate 10. Afterwards, a relatively deep shallow trench isolation (STI) 20 is formed surrounding and electrically isolating the individual device regions in which the p-type semiconductor substrate 10 and a portion of the n-well region 15 are built, thereby forming a PMOSFET active region 500 and an NMOSFET active region 505. A channel 25 is formed using ion implantation procedures and an ion source such as boron (B) or boron fluoride (BF$_2$), at an energy about 10 KeV, to implant a dosage about 1.0 E 12 atoms/cm$^2$, into the PMOSFET active region 500 and the NMOSFET active region 505. Afterwards, a gate oxide layer 30 is formed, using thermal oxidation comprising a dry oxidation and a wet oxidation, on the PMOSFET active region 500 and the NMOSFET active region 505. The polysilicon layer is formed using low-pressure chemical vapor deposition (LPCVD) procedures and silane (SiH$_4$) as a source gas, at a temperature between about 600° C. to 650° C. to a thickness between about 1000 to 2500 angstroms. Next, the polysilicon gate 35 and the gate oxide layer 30 are etched to form a PMOSFET gate pattern 45 on the PMOSFET active region 500 and an NMOSFET gate pattern 40 on the NMOSFET active region 505.

Figure 2:
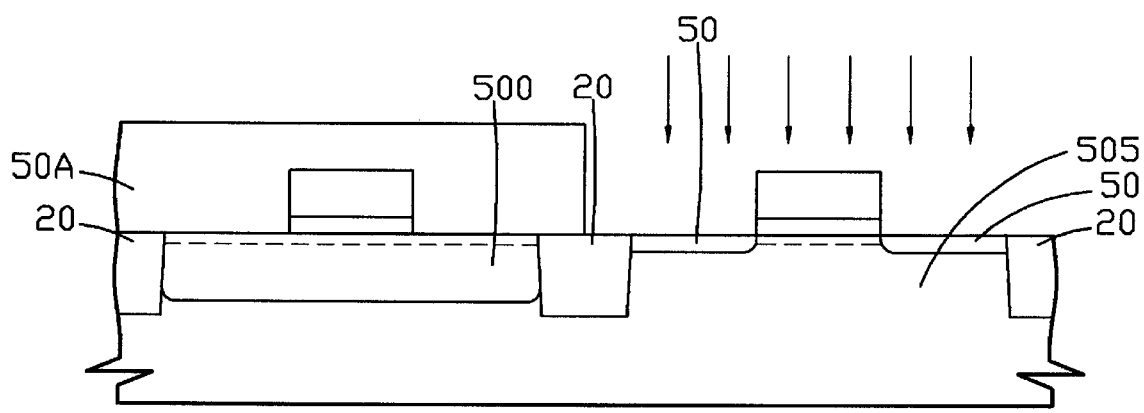

Referring to FIG. 2, a first defined photoresist layer 50A is formed on the PMOSFET active region 500 and a portion of the shallow trench isolation 20. Afterwards, an n$^-$-type lightly doped source/drain 50 is formed, using ion implantation procedures and an ion source, such as phosphorus (P) or arsenic (As), at an energy less than about 30 KeV, to implant a dosage between about 1.0 E 14 to 5.0 E 15 atoms/cm$^2$ into the NMOSFET active region 505. Then the first defined photoresist layer 50A is removed.

Figure 3:
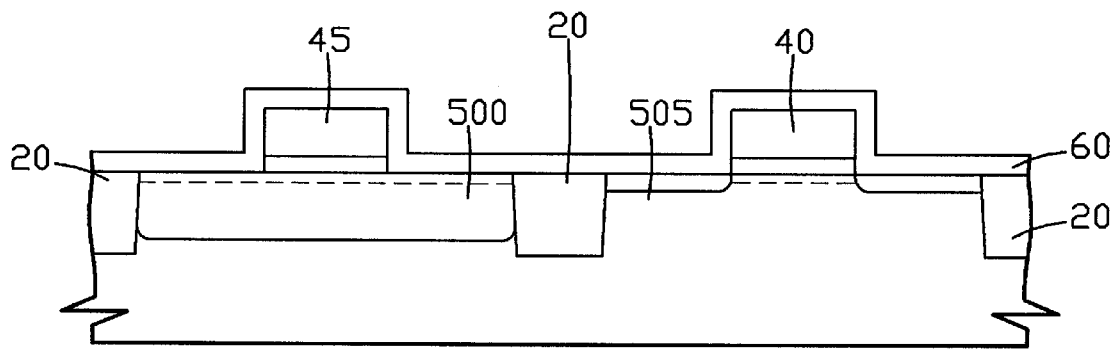

Referring to FIG. 3, a first dielectric layer 60 is deposited, comprising silicon oxide, silicon nitride, or silicon oxide/silicon nitride, on the shallow trench isolation 20, the NMOSFET gate pattern 40, the PMOSFET gate pattern 45, the NMOSFET active region 505, and the PMOSFET active region 500. The silicon oxide is deposited using low-pressure chemical vapor deposition (LPCVD) procedures and TEOS as a source gas, at a temperature between about 500° C. to 800° C. to a thickness between about 50 to 300 angstroms. The silicon nitride is deposited, using low pressure chemical vapor deposition (LPCVD) procedures, at a temperature about 750° C., to a thickness between about 50 to 300 angstroms. The silicon oxide/silicon nitride is deposited, using low-pressure chemical vapor deposition (LPCVD) procedures, at a temperature between about 500° C. to 800° C. and to a thickness between about 100 to 300 angstroms.

Figure 4:
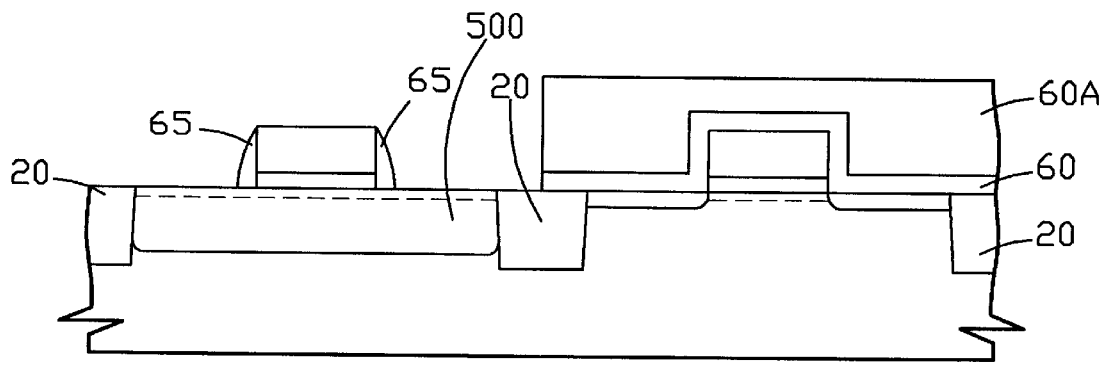

Referring to FIG. 4, a second defined photoresist layer 60A is formed on the first dielectric layer 60. Afterwards, a portion of the first dielectric layer 60 is firstly etched, using reactive ion etching (RIE) procedures with CHF$_3$ as an etchant, on the PMOSFET active region 500 and a portion of the shallow trench isolation 20. Then an offset spacer 65 is formed on the PMOSFET active region 500 during a portion of the first dielectric layer 60 etching step. Next, the second defined photoresist layer 60A is removed.

Figure 5:
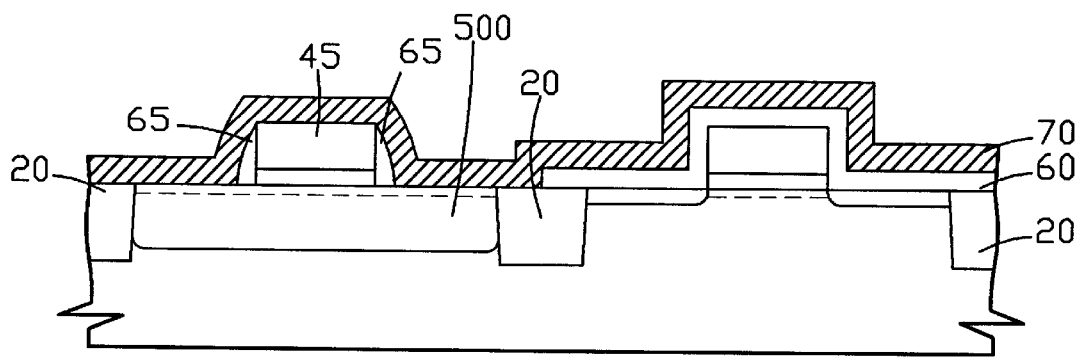

Referring to FIG. 5, a Si—B (silicon-boron) layer 70 is deposited, using ultra-high vacuum chemical vapor deposition (UHV/CVD) procedures and a source gas, such as SiH$_4$ and B$_2$H$_6$, a thickness between about 100 to 300 angstroms, on a portion of the shallow trench isolation 20, the PMOSFECT active region 500, the PMOSFET gate pattern 45, the offset spacer 65, and the first dielectric layer 60.

Figure 6:
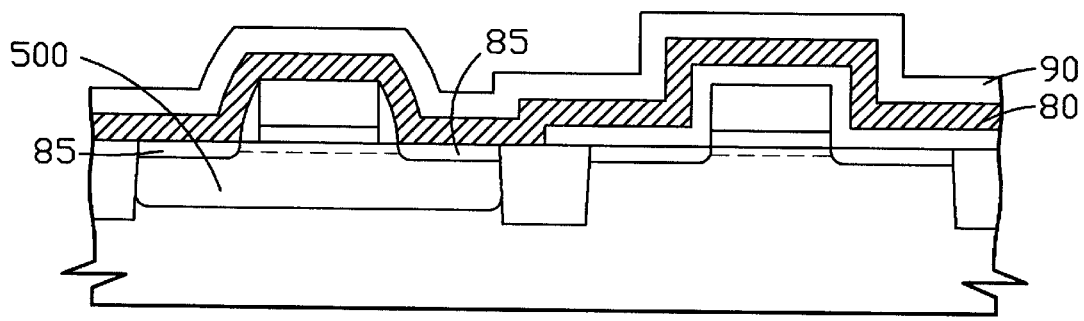

Referring to FIG. 6, the Si—B layer 70 (as shown in FIG. 5) is oxidized, using a rapid thermal processing (RTP), at a temperature between about 800° C. to 1000° C., at a time between about 10 to 60 seconds, to form the BSG layer 80, thereby firstly diffusing boron atoms into the PMOSFET active region 500 to form a p$^-$-type lightly doped source/drain 85. The boron atoms have a concentration about 5.0 E 21 atoms/cm$^3$. Afterwards, a second dielectric layer 90 is deposited, comprising silicon oxide or silicon nitride, on the BSG layer 80. The silicon oxide is deposited, using low pressure chemical vapor deposition (LPCVD) procedures and TEOS as a source gas, at a temperature between about 500° C. to 800° C., to a thickness between about 500 to 2000 angstroms. The silicon nitride is deposited, using low pressure chemical vapor deposition (LPCVD) procedures, at a temperature about 750° C., to a thickness between about 500 to 2000 angstroms.

Figure 7:
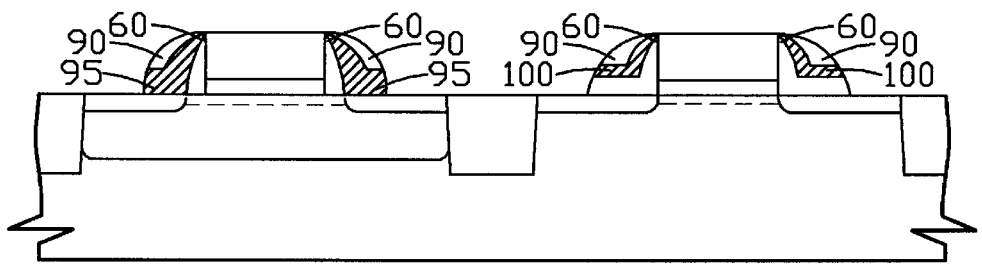

Referring to FIG. 7, a first BSG spacer 95 and a second BSG spacer 100 is formed, thereby etching a portion of the second dielectric layer 90, a portion of the BSG layer 80, and secondly etching a portion of the first dielectric layer 60. The second dielectric layer 90, the BSG layer 80, and the first dielectric layer 60 are etched, using reactive ion etching (RIE) procedures with CHF$_3$ as an etchant.

Figure 8:
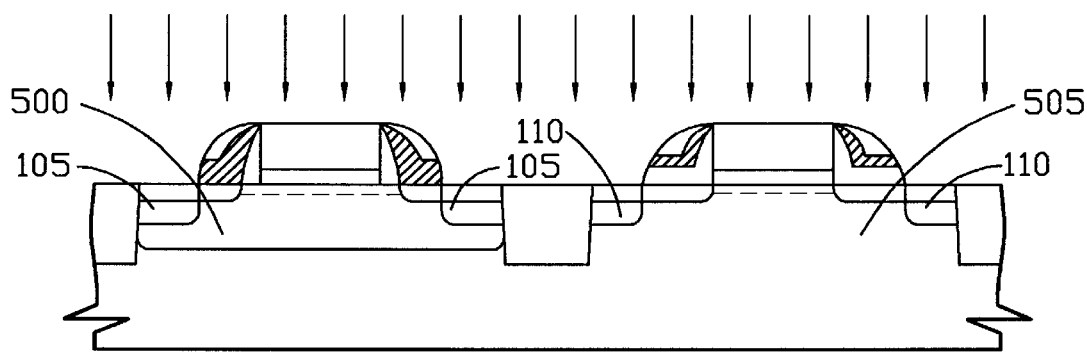

Referring to FIG. 8, a p$^+$-type heavily doped source/drain 105 is formed, using ion implantation procedures and an ion source, such as boron (B) or boron fluoride (BF$_2$), at an energy between about 1 KeV to 80 KeV, to implant a dosage between about 1.0 E 15 to 1.0 E 16 atoms/cm$^2$, into the PMOSFET active region 500. Afterwards, an n$^+$-type heavily doped source/drain 110 is formed, using ion implantation procedures and an ion source, such as phosphorus (P) or arsenic (As), at an energy between about 10 KeV to 80 KeV, to implant a dosage between about 1.0 E 15 to 1.0 E 16 atoms/cm$^2$, into the NMOSFET active region 505.

Figure 9:
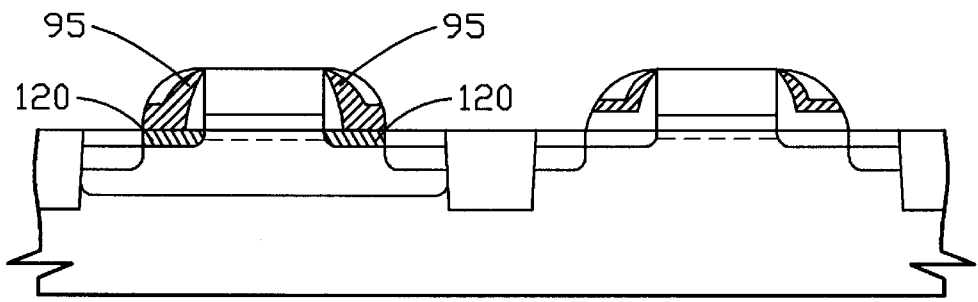

Referring to FIG. 9, the first BSG spacer 95 is annealed, using a rapid thermal processing (RTP), at a temperature between about 950° to 1050° C., at a time between about 10 to 60 seconds, thereby secondly diffusing boron atoms into the bottom region of the first BSG spacer 95 to form a source/drain extension junction 120 in a PMOSFET.

Although specific embodiments have been illustrated and described, it will be obvious to those skilled in the art that various modifications may be made without departing from the spirit which is intended to be limited solely by the appended claims.

What is claimed is:

1. A method of fabricating complementary metal-oxide-semiconductor, said method comprising:
   providing a semiconductor substrate having a first conductivity type;
   forming a well region into said semiconductor substrate, said well region having a second conductivity type, said second conductivity type being opposite to said first conductivity type;

forming a shallow trench isolation (STI) into said semiconductor substrate and said well region, thereby forming a plurality of active regions therebetween;

forming a channel into said semiconductor substrate and said well region;

forming a PMOSFET gate pattern and a NMOSFET gate pattern over said semiconductor substrate and said well region;

forming a first defined photoresist layer over said well region;

implanting a first dopant of said second conductivity type into said semiconductor substrate to form a first lightly doped source/drain;

removing said first defined photoresist layer;

depositing a first insulating layer over said semiconductor substrate and said well region;

forming a second defined photoresist layer over said first insulating layer;

firstly etching a portion of said first insulating layer over said well region;

forming an offset spacer over said well region during a portion of said first insulating layer etching step;

removing said second defined photoresist layer;

depositing a Si—B (silicon-boron) layer over said well region and said first insulating layer;

oxidizing said Si—B layer to form a BSG layer, thereby firstly diffusing boron atoms into said well region to form a second lightly doped source/drain;

depositing a second insulating layer on said BSG layer;

etching a portion of said second insulating layer, a portion of said BSG layer, and secondly etching a portion of said first insulating layer to form a first BSG spacer and a second BSG spacer;

implanting a first dopant of said first conductivity type into said well region to form a first heavily doped source/drain;

implanting a second dopant of said second conductivity type into said semiconductor substrate to form a second heavily doped source/drain, where a concentration of said second dopant is greater than that of said first dopant; and annealing said first BSG spacer, thereby secondly diffusing said boron atoms thereof into a below region of said first BSG spacer to form a source/drain extension junction.

2. The method according to claim 1, wherein said semiconductor substrate comprises a concentration less than about 1.0 E 15 atoms/cm.sup.3.

3. The method according to claim 1, wherein said first conductivity type comprises a p-type.

4. The method according to claim 1, wherein said well region is formed, comprising ion implantation procedures and phosphorus (P) as an ion source, at a energy between about 100 KeV to 200 KeV, to implant a dosage between about 1.0 E 12 to 1.0 E 13 atoms/cm.sup.2, then using a driving-in process, at a temperature about 1000.degree.C., to form a concentration about 1.0 E 16 atoms/cm.sup.3.

5. The method according to claim 1, wherein said second conductivity type comprises a n-type.

6. The method according to claim 1, wherein said active region comprises a PMOSFET active region.

7. The method according to claim 1, wherein said active region comprises a NMOSFET active region.

8. The method according to claim 1, wherein said channel is formed, comprising ion implantation procedures and boron (B) as an ion source, at a energy about 10 KeV, to implant a dosage about 1.0 E 12 atoms/cm.sup.2.

9. The method according to claim 1, wherein said channel is formed, comprising ion implantation procedures and boron fluoride ($BF_2$) as an ion source, at a energy about 10 KeV, to implant a dosage about 1.0 E 12 atoms/cm.sup.2.

10. The method according to claim 1, wherein said PMOSFET gate pattern and said NMOSFET gate pattern are formed, comprising a polysilicon gate and a gate oxide layer.

11. The method according to claim 10, wherein said polysilicon gate comprises a polysilicon layer and a tungsten silicon ($WSi_2$) layer.

12. The method according to claim 1, wherein said first lightly doped source/drain is formed, comprising ion implantation procedures and phosphorus (P) as an ion source, at a energy less than about 30 KeV, to implant a dosage between about 1.0 E 14 to 5.0 E 15 atoms/ cm.sup.2.

13. The method according to claim 1, wherein said first lightly doped source/drain is formed, comprising ion implantation procedures and arsenic (As) as an ion source, at a energy less than about 30 KeV, to implant a dosage between about 1.0 E 14 to 5.0 E 15 atoms/cm.sup.2.

14. The method according to claim 1, wherein said first insulating layer comprises silicon oxide, using low pressure chemical vapor deposition (LPCVD) procedures and TEOS as a source gas, at a temperature between about 500.degree. to 800.degree.C., to a thickness between about 50 to 300 angstroms.

15. The method according to claim 1, wherein said first insulating layer comprises silicon nitride, using low pressure chemical vapor deposition (LPCVD) procedures, at a temperature about 750.degree.C., to a thickness between about 50 to 300 angstroms.

16. The method according to claim 1, wherein said first insulating layer comprises silicon oxide/silicon nitride, using low pressure chemical vapor deposition (LPCVD) procedures, at a temperature between about 500.degree. to 800.degree.C., to a thickness between about 100 to 300 angstroms.

17. The method according to claim 1, wherein said first insulating layer is firstly etched, comprising reactive ion etching (RIE) procedures with CHF.sub.3 as an etchant.

18. The method according to claim 1, wherein said Si—B (silicon-boron) layer is deposited, comprising ultra-high vacuum chemical vapor deposition (UHV/CVD) procedures and a source gas, such as $SiH_4$ and $B_2H_6$, a thickness between about 100 to 300 angstroms.

19. The method according to claim 1, wherein said Si—B layer is oxidized to form said BSG layer, comprising a rapid thermal processing (RTP), at a temperature between about 800.degree. to 1000.degree.C., at a time between about 10 to 60 seconds.

20. The method according to claim 1, wherein said boron atoms comprises a concentration about 5.0 E 21 atoms/ cm.sup.3.

21. The method according to claim 1, wherein said second insulating layer comprises silicon oxide, using low pressure chemical vapor deposition (LPCVD) procedures and TEOS as a source gas, at a temperature between about 500.degree. to 800.degree.C., to a thickness between about 500 to 2000 angstroms.

22. The method according to claim 1, wherein said second insulating layer comprises silicon nitride, using low pressure chemical vapor deposition (LPCVD) procedures, at a temperature about 750.degree.C., to a thickness between about 500 to 2000 angstroms.

23. The method according to claim 1, wherein said second insulating layer is etched, comprising reactive ion etching (RIE) procedures with CHF.sub.3 as an etchant.

24. The method according to claim 1, wherein said BSG layer is etched, comprising reactive ion etching (RIE) procedures with CHF.sub.3 as an etchant.

25. The method according to claim 1, wherein said first insulating layer is secondly etched, comprising reactive ion etching (RIE) procedures with CHF.sub.3 as an etchant.

26. The method according to claim 1, wherein said first heavily doped source/drain is formed, comprising ion implantation procedures and boron (B) as an ion source, at a energy between about 1 KeV to 80 KeV, to implant a dosage between about 1.0 E 15 to 1.0 E 16 atoms/cm.sup.2.

27. The method according to claim 1, wherein said first heavily doped source/drain is formed, comprising ion implantation procedures and boron fluoride ($BF_2$) as an ion source, at a energy between about 1 KeV to 80 KeV, to implant a dosage between about 1.0 E 15 to 1.0 E 16 atoms/cm.sup.2.

28. The method according to claim 1, wherein said second heavily doped source/drain is formed, comprising ion implantation procedures and phosphorus (P) as an ion source, at a energy between about 10 KeV to 80 KeV, to implant a dosage between about 1.0 E 15 to 1.0 E 16 atoms/cm.sup.2.

29. The method according to claim 1, wherein said second heavily doped source/drain is formed, comprising ion implantation a procedures and arsenic (As) as an ion source, at a energy between about 10 KeV to 80 KeV, to implant a dosage between about 1.0 E 15 to 1.0 E 16 atoms/cm.sup.2.

30. The method according to claim 1, wherein said boron atoms are secondly diffused, comprising a rapid thermal processing (RTP), at a temperature between about 950.degree. to 1050.degree.C., at a time between about 10 to 60 seconds.

31. A method of fabricating complementary metal-oxide-semiconductor (CMOS), said method comprising:

providing a p-type semiconductor substrate;

forming a n-well region into said p-type semiconductor substrate;

forming a shallow trench isolation (STI) into said p-type semiconductor substrate and a portion of said n-well region, thereby forming a PMOSFET active region and a NMOSFET active region;

forming a channel into said PMOSFET active region and said NMOSFET active region;

forming a gate oxide layer on said PMOSFET active region and said NMOSFET active region;

depositing a polysilicon gate on said gate oxide layer;

etching said polysilicon gate and said gate oxide layer, to form a PMOSFET gate pattern on said PMOSFET active region and a NMOSFET gate pattern on said NMOSFET active region;

forming a first defined photoresist layer over said PMOSFET active region and a portion of said shallow trench isolation;

implanting a $n^-$-type dopant into said NMOSFET active region to form a $n^-$-type lightly doped source/drain;

removing said first defined photoresist layer;

depositing a first dielectric layer on said shallow trench isolation, said NMOSFET gate pattern, said PMOSFET gate pattern, said NMOSFET active region, and said PMOSFET active region;

forming a second defined photoresist layer over said first dielectric layer;

firstly etching a portion of said first dielectric layer on said PMOSFET active region and a portion of said shallow trench isolation;

forming an offset spacer on said PMOSFET active region during a portion of said first dielectric layer etching step;

removing said second defined photoresist layer;

depositing a Si—B (silicon-boron) layer on a portion of said shallow trench isolation, said PMOSFET active region, said PMOSFET gate pattern, said offset spacer, and said first dielectric layer;

oxidizing said Si—B layer to form a BSG layer, thereby firstly diffusing boron atoms into said PMOSFET active region to form a $p^-$-type lightly doped source/drain;

depositing a second dielectric layer on said BSG layer;

etching a portion of said second dielectric layer, a portion of said BSG layer and secondly etching a portion of said first dielectric layer to form a first BSG spacer and a second BSG spacer;

implanting a $p^+$-type dopant into said PMOSFET active region to form a $p^+$-type heavily doped source/drain;

implanting a $n^+$-type dopant into said NMOSFET active region to form a $n^+$-type heavily doped source/drain; and annealing said first BSG spacer, thereby secondly diffusing said boron atoms into a below region of said first BSG spacer to form a source/drain extension junction in a PMOSFET.

32. The method according to claim 31, wherein said p-type semiconductor substrate comprises a concentration less than about 1.0 E 15 atoms/cm.sup.3.

33. The method according to claim 31, wherein said n-well region is formed, comprising ion implantation procedures and phosphorus (P) as an ion source, at a energy between about 100 KeV to 200 KeV, to implant a dosage between about 1.0 E 12 to 1.0 E 13 atoms/cm.sup.2, then using a driving-in process, at a temperature about 1000.degree.C., to form a concentration about 1.0 E 16 atoms/cm.sup.3.

34. The method according to claim 31, wherein said channel is formed, comprising ion implantation procedures and boron (B) as an ion source, at a energy about 10 KeV, to implant a dosage about 1.0 E 12 atoms/cm.sup.2.

35. The method according to claim 31, wherein said channel is formed, comprising ion implantation procedures and boron fluoride ($BF_2$) as an ion source, at a energy about 10 KeV, to implant a dosage about 1.0 E 12 atoms/cm.sup.2.

36. The method according to claim 31, wherein said gate oxide layer is formed, comprising a thermal oxidation.

37. The method according to claim 36, wherein said thermal oxidation comprises a dry oxidation and a wet oxidation.

38. The method according to claim 31, wherein said polysilicon gate is formed, comprising low pressure chemical vapor deposition (LPCVD) procedures and silane ($SiH_4$) as a source gas, at a temperature between about 600.degree. to 650.degree.C., to a thickness between about 1000 to 2500 angstroms.

39. The method according to claim 31, wherein said $n^-$-type lightly doped source/drain is formed, comprising ion implantation procedures and phosphorus (P) as an ion source, at a energy less than about 30 KeV, to implant a dosage between about 1.0 E 14 to 5.0 E 15 atoms/cm.sup.2.

40. The method according to claim 31, wherein said $n^-$-type lightly doped source/drain is formed, comprising ion implantation procedures and arsenic (As) as an ion source, at a energy less than about 30 KeV, to implant a dosage between about 1.0 E 14 to 5.0 E 15 atoms/cm.sup.2.

41. The method according to claim 31, wherein said first dielectric layer comprises silicon oxide, using LPCVD procedures and TEOS as a source gas, at a temperature between about 500.degree. to 800.degree.C., to a thickness between about 50 to 300 angstroms.

42. The method according to claim 31, wherein said first dielectric layer comprises silicon nitride, using low pressure chemical vapor deposition (LPCVD) procedures, at a temperature about 750.degree.C., to a thickness between about 50 to 300 angstroms.

43. The method according to claim 31, wherein said first dielectric layer comprises silicon oxide/silicon nitride, using low pressure chemical vapor deposition (LPCVD) procedures, at a temperature between about 500.degree. to 800.degree.C., to a thickness between about 100 to 300 angstroms.

44. The method according to claim 31, wherein said first dielectric layer is firstly etched, comprising reactive ion etching (RIE) procedures with $CHF_3$ as an etchant.

45. The method according to claim 31, wherein said Si—B (silicon-boron) layer is deposited, comprising ultra-high vacuum chemical vapor deposition (UHV/CVD) procedures and a source gas, such as $SiH_4$ and $B_2H_6$, a thickness between about 100 to 300 angstroms.

46. The method according to claim 31, wherein said Si—B layer is oxidized to form said BSG layer, comprising a rapid thermal processing (RTP), at a temperature between about 950.degree. to 1000.degree.C., at a time between about 10 to 60 seconds.

47. The method according to claim 31, wherein said boron atoms comprises a concentration about 5.0 E 21 atoms/cm.sup.3.

48. The method according to claim 31, wherein said second dielectric layer comprises silicon oxide, using low pressure chemical vapor deposition (LPCVD) procedures and TEOS as a source gas, at a temperature between about 500.degree. to 800.degree.C., to a thickness between about 500 to 2000 angstroms.

49. The method according to claim 31, wherein said second dielectric layer comprises silicon nitride, using low pressure chemical vapor deposition (LPCVD) procedures, at a temperature about 750.degree.C., to a thickness between about 500 to 2000 angstroms.

50. The method according to claim 31, wherein said second dielectric layer is etched, comprising reactive ion etching (RIE) procedures with $CHF_3$ as an etchant.

51. The method according to claim 31, wherein said BSG layer is etched, comprising reactive ion etching (RIE) procedures with $CHF_3$ as an etchant.

52. The method according to claim 31, wherein said first dielectric layer is secondly etched, comprising reactive ion etching (RIE) procedures with $CHF_3$ as an etchant.

53. The method according to claim 31, wherein said $p^+$-type heavily doped source/drain is formed, comprising ion implantation procedures and boron (B) as an ion source, at a energy between about 1 KeV to 80 KeV, to implant a dosage between about 1.0 E 15 to 1.0 E 16 atoms/cm.sup.2.

54. The method according to claim 31, wherein said $p^+$-type heavily doped source/drain is formed, comprising ion implantation procedures and boron fluoride ($BF_2$) as an ion source, at a energy between about 1 KeV to 80 KeV, to implant a dosage between about 1.0 E 15 to 1.0 E 16 atoms/cm.sup.2.

55. The method according to claim 31, wherein said $n^+$-type heavily doped source/drain is formed, comprising ion implantation procedures and phosphorus (P) as an ion source, at a energy between about 10 KeV to 80 KeV, to implant a dosage between about 1.0 E 15 to 1.0 E 16 atoms/cm.sup.2.

56. The method according to claim 31, wherein said $n^+$-type heavily doped source/drain is formed, comprising ion implantation procedures and arsenic (As) as an ion source, at a energy between about 10 KeV to 80 KeV, to implant a dosage between about 1.0 E 15 to 1.0 E 16 atoms/cm.sup.2.

57. The method according to claim 31, wherein said boron atoms are secondly diffused, comprising a rapid thermal processing (RTP), at a temperature between about 950.degree. to 1050.degree.C., at a time between about 10 to 60 seconds.

* * * * *